United States Patent [19]
Rivera

[11] 3,983,836
[45] Oct. 5, 1976

[54] INDICATOR BAR FOR AUTOMOBILE RADIO
[75] Inventor: Maria Rivera, Chicago, Ill.
[73] Assignee: The Raymond Lee Organization, Inc., New York, N.Y. ; a part interest
[22] Filed: July 7, 1975
[21] Appl. No.: 593,656

[52] U.S. Cl. .................. 116/124.1 R; 116/DIG. 31; 116/124.4
[51] Int. Cl.² .......................................... H03J 1/04
[58] Field of Search ............ 116/124.1 R, 124.1 A, 116/124.4, 129 E, 129 F, DIG. 36, DIG. 29, DIG. 31; 240/2.1; 334/86

[56] References Cited
UNITED STATES PATENTS

| | | | |
|---|---|---|---|
| 1,898,642 | 2/1933 | Ogle | 116/124.4 |
| 2,120,136 | 6/1938 | Lyman | 116/124.1 R |
| 2,804,041 | 8/1957 | Neugass | 116/124.4 |
| 3,513,805 | 5/1970 | Sizer | 116/124.4 |

*Primary Examiner*—S. Clement Swisher
*Assistant Examiner*—Denis E. Corr
*Attorney, Agent, or Firm*—Howard I. Podell

[57] ABSTRACT

An indicator bar assembly for an automobile radio in which a reflector surface of the slidable indicator bar reflects light through one of a plurality of separately colored plastic fixed indicators to indicate the radio station to which the radio is tuned.

3 Claims, 4 Drawing Figures

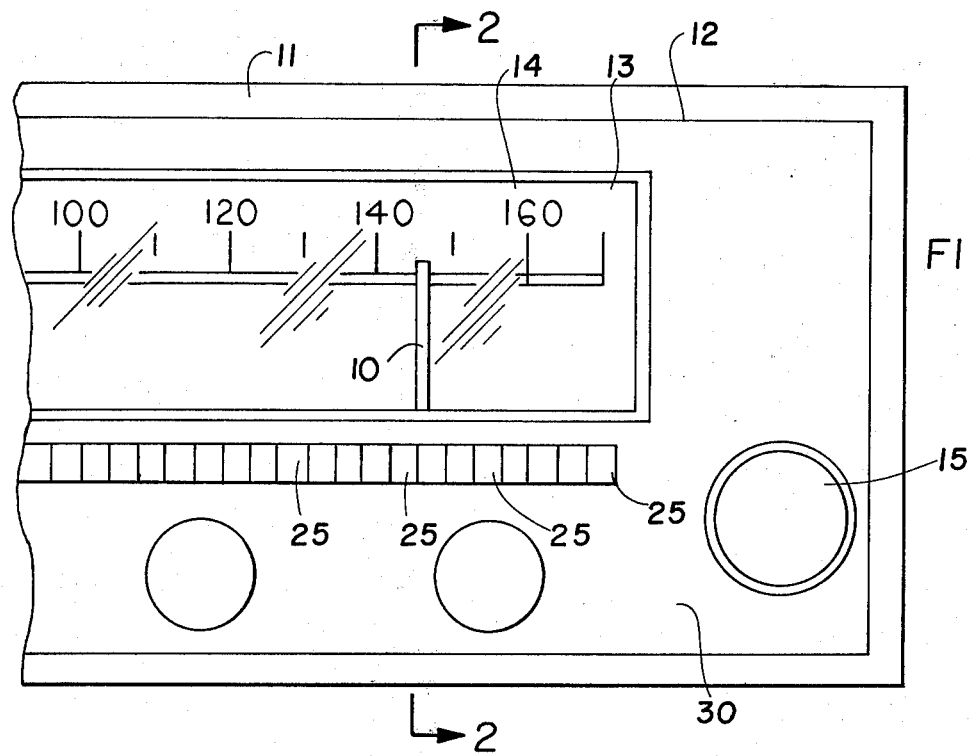
FIG. 1
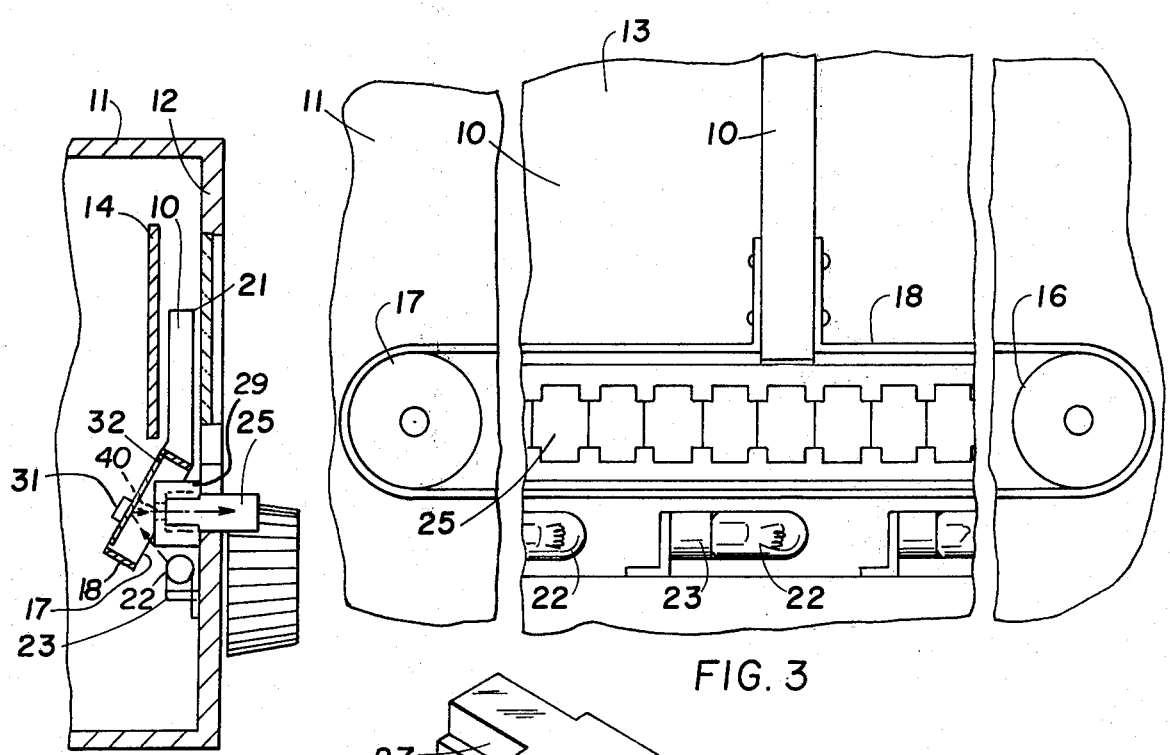
FIG. 2
FIG. 3
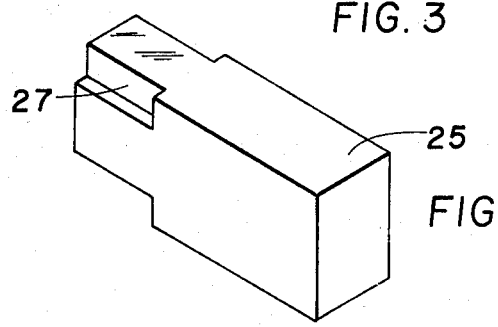
FIG. 4

INDICATOR BAR FOR AUTOMOBILE RADIO

SUMMARY OF THE INVENTION

My invention relates to an indicator bar assembly for an automobile radio, wherein the indicator bar illuminates one of a plurality of colored plastic buttons to indicate the radio station to which the radio is tuned. The indicator bar is slidably mounted on a pulley belt in front of a conventional number scale to indicate wave length to which the radio is tuned.

A reflector is mounted on the indicator bar which also reflects light from a fixed source through one of a plurality of colored plastic tabs, with the color of the illuminated tab indicating also the position of the indicator bar.

The invention is also applicable for installation in other types of radios including portable and stereo radios.

BRIEF DESCRIPTION OF THE DRAWINGS

The objects and features of the invention may be understood with reference to the following detailed description of an illustrative embodiment of the invention, taken together with the accompanying drawings in which:

FIG. 1 illustrates a front view of the invention;

FIG. 2 illustrates an end sectional view of the invention taken along line 2—2 of FIG. 1;

FIG. 3 illustrates a front view of the internal mechanism of the invention; and

FIG. 4 illustrates a front view of an indicator tab of the invention.

DESCRIPTION OF THE PREFERRED EMBODIMENT

Turning now descriptively to the drawings, in which similar reference characters denote similar elements throughout the several views, FIGS. 1–3 show an indicator bar 10 fitted on a conventional automobile radio 11. The radio 11 comprises a housing 12 with a transparent front panel face 13 behind which a conventional number scale 14 is fitted against which the indicator bar 10 indicates the wavelength to which the radio is tuned. Indicator bar 10 is mounted on a belt 18 that revolves about a free pulley 17 and a tuning knob shaft pulley 16, with rotation of external tuning knob 15 serving to move indicator bar 10 sideways over the scale 14.

A set of light bulbs 22 are mounted in sockets 23 inside housing 12 below a row of transparent colored plastic tabs 25 mounted in the front panel 30 of the radio 11. Tabs 25 extend the length of the number scale 14. The tabs 25 are shielded from direct view of the light bulbs 22. A mirror 31 is mounted on an arm member 32 attached to the indicator bar 10 and located so as to reflect light from one or more bulbs 22 to the individual plastic tab 25 that is directly below the indicator bar 10 to indicate the position of the indicator bar 10 by the indication of light through the said plastic tab 25.

Each plastic tab 25 may be of a different color or hue and each bulb 22 may be individually colored so that the visual display of a unique color of reflected light from a bulb 22 as seen through a plastic tab 25 indicates the radio station to which the radio 11 is tuned.

Plastic tabs 25 may be formed with a shaped recess to fit into sockets 29 so that the tabs 25 may be readily removed and replaced with sockets 29 having an open or transparent window 40, at their rear to transmit light from mirror 31 to an attached tab 25. The remainder of each socket 29 is opaque to shield the attached tab 25 from direct view of the light bulbs 22.

Since obvious changes may be made in the specific embodiment of the invention described herein, such modifications being within the spirit and scope of the invention claimed, it is indicated that all matter contained herein is intended as illustrative and not as limiting in scope.

Having thus described the invention, what I claim as new and desire to secure by Letters Patent of the United States is:

1. A slide bar indicator mechanism for a radio which indicated by means of the display of individual colored light, the tuned setting of the radio, comprising
    a slide bar indicator linked to the tuning mechanism of the radio which is moved across a numbered scale in response to rotation of the tuning knob of the radio,
    a set of transparent individually colored plastic indicators mounted parallel to the numbered scale mounted in the front panel of the radio,
    a fixed light source mounted in the housing of the radio which is shielded from direct view of the transparent indicators, and
    a mirror mounted on an arm attached to the slide bar indicator that reflects light from the fixed light source through one or more transparent indicators depending on the setting of the slide bar indicator.

2. The combination as recited in claim 1 in which a plurality of fixed light sources are mounted along the length travel of the slide bar indicator.

3. The combination as recited in claim 2 in which each fixed light source is of a different color.

* * * * *